Nov. 29, 1960 W. GREATBATCH 2,962,665
TRANSISTOR AMPLIFIER WITH DAMAGE CONTROL
Filed Feb. 24, 1958
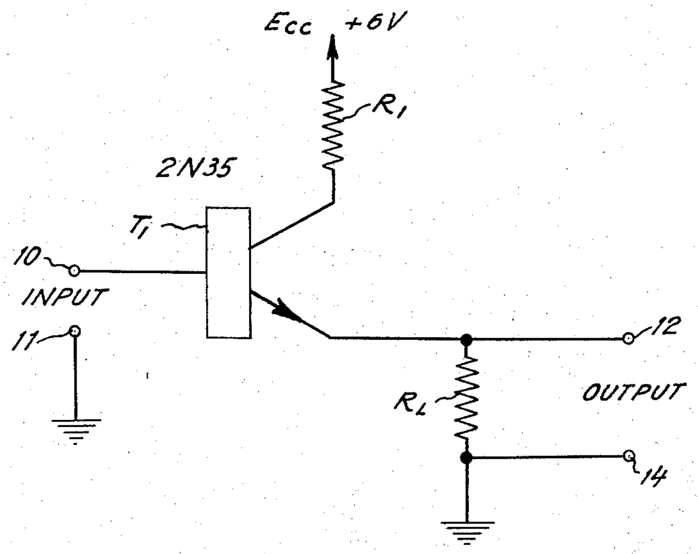

2,962,665
Patented Nov. 29, 1960

2,962,665

TRANSISTOR AMPLIFIER WITH DAMAGE CONTROL

Wilson Greatbatch, Clarence, N.Y., assignor to Taber Instrument Corporation, North Tonawanda, N.Y., a corporation of New York Filed Feb. 24, 1958, Ser. No. 716,987

2 Claims. (Cl. 330—32)

This invention relates to transistor amplifiers and more particularly to an improved transistor amplifier which incorporates damage control means to prevent injury to the transistor due to unusual operating conditions.

One of the inherent disadvantages of transistors, not found in vacuum tubes, is the increase in the transistors current as the temperature increases. The increase in current, in turn, causes the temperature of the transistor to increase still further, thus resulting in the further increase of current flow. This cumulative process causes the transistor to "run away" until saturation currents are produced which result in permanent damage to the transistor.

Another abnormal condition which may result in permanent damage to a transistor is when the transistor is overdriven, causing excessive currents to flow.

Still another abnormal condition is where the load resistor becomes short circuited, or where the load resistance becomes too low, thereby causing excessive currents to flow and thus damaging the transistor.

Still another condition causing permanent damage to the transistor occurs when the polarity of the power supply should for one reason or another become reversed.

When a transistor is subjected to the above abnormal conditions, the damage may result in outright failure of the transistor, or what may be more serious, a change in the characteristics of the transistor. Where there is an outright failure, this becomes immediately apparent and the transistor can be replaced. Where the damage results in a change of the transistors' characteristics, this may go unnoticed under test conditions, but become serious under service conditions. This is especially serious in the case where the transistor is part of a missile guidance system. Here, a transistor that was previously overloaded may appear normal in tests on the launching pad, yet after launching, when subjected to high temperatures, develops such different characteristics as to seriously affect the course of the missile.

It is, therefore, an object of this invention to provide a novel type of transistor amplifier which incorporates means to prevent damage to the transistor when the amplifier is subjected to abnormal operating conditions.

Another object of this invention is to provide a grounded collector transistor amplifier having means to prevent damage to the transistor, should the amplifier be subjected to abnormal operating conditions.

A further object of this invention is to provide a grounded collector transistor amplifier with current limiting means to prevent damage to the transistor when the amplifier is subjected to operating conditions beyond the ratings of the transistor.

A still further object is to provide a grounded collector transistor amplifier having means to limit the maximum current which can be drawn through the collector circuit under unusual operating conditions.

Still another object is to provide a grounded collector transistor amplifier having current limiting means in the collector circuit which has negligible effect during normal operation, but is operative during abnormal operating conditions to prevent damage to the transistor.

These and other objects and features of the invention may be better understood from a consideration of the following detailed description when taken in conjunction with the accompanying drawing in which the single figure shows a schematic circuit diagram of one embodiment of the transistor amplifier according to the invention.

Referring now to the drawing, a transistor T1 having an emitter, collector and base element is shown arranged in the grounded collector configuration. The input terminal 10 is connected directly to the base of the transistor while the second input terminal 11 is shown connected to a common point or ground. A conventional output resistor $R_L$ is connected from the emitter to a common point or ground. The output terminal 12 is connected to the emitter of T1 while the other output terminal 14 is connected to ground. Unlike grounded collector transistor amplifiers known to the art, the figure shows a resistor R1 connected from the collector of transistor T1 to a source of unidirection potential.

The operation of a typical embodiment of the invention is best understood if considered in connection with the circuit values and the factors involved in their selections.

In the typical embodiment shown, the amplifier has the following circuit values:

| | |
|---|---|
| Transistor T1 | 2N35 Sylvania NPN Junction Type. |
| Ecc | 6 volts. |
| $R_L$ | 50,000 ohms. |
| R1 | 500 ohms. |

These values are given merely for illustrative purposes and are in no way to be considered as limiting the invention to circuits with the given parameters.

In selecting the proper value of R1 in accordance with the invention, it must be noted that a grounded-collector amplifier stage has a voltage gain of nearly 1.0. When the output of a grounded collector transistor stage is short circuited or the impedance materially reduced, the transistor will try to maintain the previous output voltage by bringing large values of current through the zero or lowered resistance load. These large currents can irreparably damage the transistor. Such short-circuit damage is unique to transistor amplifiers having a grounded collector configuration. It is not present with amplifier of either the grounded emitter or grounded base configuration since these configurations have a collector load resistor as part of the circuit whereas grounded the collector configuration does not call for a resistor in the collector circuit.

Similarly, if the base of a conventional grounded collector is overdriven in a positive direction, the transistor output voltage will attempt to follow the input voltage. If the input voltage goes up to the collector supply voltage, for example 6 volts, the emitter voltage will also try to go to 6 volts. Such an excessive output voltage across the load would cause excessive currents in the load. Since the load current flows through the transistor, the transistor could be damaged.

Another consideration is the possibility that the polarity of the power supply becomes reversed. If this should happen, the collector-base junction would be biased in the direction of easy conduction and excessive collector currents would then flow from the power supply, through the collector, across the collector-base junction, through the base and then through the low impedance of the signal source to ground. In a conventional grounded collector transistor amplifier, the transistor would be irreparably damaged.

Referring to the circuit values above, it is noted that the component value for the load resistor $R_L$ is 50,000 ohms which is a conventional load for the transistor used where R1 is merely 500 ohms, approximately one-hundredth of $R_L$. Under normal operating conditions the 500 ohm resistor has very little or negligible effect on the operation of the ampifier.

However, if the transistor should (1) be overdriven in the positive direction, (2) output be short circuited, or (3) the polarity of the power supply be reversed, the transistor would conduct heavily and the voltage drop across it would decrease to near zero. Under these conditions, the transistor current would be:

$$Ic=\frac{Ecc}{R1}=\frac{6\text{ volts}}{500\text{ ohms}}=12\text{ milliamperes}$$

This current is not enough to damage the 2N35 transistor. Thus, it is seen that the resistor R1 limits the transistor current to a safe value and yet is not large enough to have any deleterious effect during normal operating conditions. The resistor R1 also serves to limit the collector current, should the transistor attempt to "run away" because of excess heat.

The value of the "damage control" resistor R1 is determined by consulting the manufacturer's specifications for the maximum collector current that the transistor can tolerate. Substituting in the following equation, where Ecc equals the collector supply voltage; I equals the maximum safe collector current, the value of damage control resistor R1 can be found.

$$R1=\frac{Ecc}{I}$$

The 2N35 Sylvania resistor can tolerate a collector current of 12 milliamperes without damage. If the collector supply voltage is 6 volts, then $$R1=\frac{6\text{ volts}}{12\text{ ma.}}=500\text{ ohms}$$

Another basis for computing the value of the "damage control" resistor is to select the resistor to limit the transistor current to a value which will not exceed the maximum rated dissipation of the transistor at one-half the supply voltage. The reason for this is that maximum power will be dissipated in the transistor when the collector voltage is one-half the supply voltage.

While one embodiment of the invention has been described with a junction NPN type transistor, the invention will operate just as well with junction PNP type transistors, point contact PNP and NPN types as well as other types of transistors. Of course, appropriate changes will have to be made in the supply voltages as is known to those skilled in the art.

Having set forth and described with particularity the best mode of the invention, it will be obvious to those skilled in the art that the circuit described herein is capable of various modifications within the spirit and scope of the invention and is to be taken as illustrative rather than limiting.

I claim:

1. A transistor amplifier comprising a junction transistor having at least a base, an emitter and a collector element, said transistor being connected to an emitter load resistor in the grounded collector configuration, input means to the base electrode and output means provided solely at the emitter electrode, and a damage control resistor connected between said collector and a source of unidirectional current, the resistance value of said damage control resistor being predetermined to have negligible effect on the operation of the amplifier during normal conditions but having a resistance value large enough to prevent damage to the transistor from excessive power dissipation in the transistor under conditons causing large collector currents to flow.

2. The invention according to claim 1 wherein the value of the resistor is determined by the formula $$R=\frac{Ecc}{I}$$

Where Ecc is the collector supply voltage, I is the inherent maximum current which the transistor can safely pass without damage, and where R is the minimum value of the resistor which can provide damage control.

References Cited in the file of this patent

UNITED STATES PATENTS

| | | |
|---|---|---|
| 2,653,282 | Darling | Sept. 22, 1953 |
| 2,662,122 | Ryder | Dec. 8, 1953 |
| 2,695,381 | Darling | Nov. 23, 1954 |
| 2,801,298 | Mital | July 30, 1957 |
| 2,858,379 | Stanley | Oct. 28, 1958 |

OTHER REFERENCES

Sulzer: "Junction Transistor Circuit Applications," Electronics, August 1953, pages 170–173.